United States Patent
McIntosh et al.

(10) Patent No.: US 8,970,265 B2
(45) Date of Patent: Mar. 3, 2015

(54) SYSTEMS AND METHODS FOR DRIVING A LOAD UNDER VARIOUS POWER CONDITIONS

(71) Applicant: Allegro Microsystems, LLC, Worcester, MA (US)

(72) Inventors: James McIntosh, Longniddry (GB); Christy Looby, Edinburgh (GB)

(73) Assignee: Allegro Microsystems, LLC, Worcester, MA (US)

( * ) Notice: Subject to any disclaimer, the term of this patent is extended or adjusted under 35 U.S.C. 154(b) by 14 days.

(21) Appl. No.: 13/827,074

(22) Filed: Mar. 14, 2013

(65) Prior Publication Data

US 2014/0266323 A1    Sep. 18, 2014

(51) Int. Cl.
*H03K 17/00* (2006.01)
*H02M 1/08* (2006.01)
*H03K 17/0812* (2006.01)

(52) U.S. Cl.
CPC .................. *H03K 17/00* (2013.01); *H02M 1/08* (2013.01); *H03K 17/08122* (2013.01)
USPC .......................................... 327/112; 327/108

(58) Field of Classification Search
USPC .................................. 327/108, 112, 109, 110
See application file for complete search history.

(56) References Cited

U.S. PATENT DOCUMENTS

| | | |
|---|---|---|
| 6,385,028 B1 | 5/2002 | Kouno |
| 6,897,706 B2 | 5/2005 | Coutu |
| 7,327,546 B2 | 2/2008 | Thiery |
| 8,390,341 B2 * | 3/2013 | Sugie ............................ 327/112 |
| 2008/0192390 A1 | 8/2008 | Yoshida |

FOREIGN PATENT DOCUMENTS

| | | |
|---|---|---|
| JP | 2000-77537 | 3/2000 |
| WO | WO 03/019780 A1 | 3/2003 |

OTHER PUBLICATIONS

Texas Instruments "UC2625-EP SLU802 Brushless DC Motor Controller;" Production Data Information; Mar. 2008; 25 pages.
PCT Search Report and Written Opinion of the ISA dated Sep. 24, 2014; for PCT Pat. App. No. PCT/US2014/015701; 11 pages.

* cited by examiner

*Primary Examiner* — Hai L Nguyen
(74) *Attorney, Agent, or Firm* — Daly, Crowley, Mofford & Durkee, LLP

(57) ABSTRACT

An electronic circuit for driving an electronic switch includes a first voltage terminal coupled to receive a first voltage from a power supply and a second voltage terminal coupled to receive a second voltage from the power supply. A driver circuit is configured to drive the voltage at a control terminal of the electronic switch to an intermediate voltage level in order to turn on the electronic switch during a high or normal voltage condition. A clamp circuit is configured to clamp the voltage at the control terminal of the electronic switch to the second voltage terminal in order to turn on the electronic switch during a low voltage condition, so that the electronic switch can enhance power provided to a load during the low voltage condition. A low voltage detection circuit detects the low voltage condition and provides a signal to activate the clamp circuit.

19 Claims, 5 Drawing Sheets

SYSTEMS AND METHODS FOR DRIVING A LOAD UNDER VARIOUS POWER CONDITIONS

FIELD

This disclosure relates to systems and methods for driving a load and, more particularly, to systems and methods for driving a load under high, normal, and low power conditions.

BACKGROUND

Electronic circuits referred to as H-bridges are often used drive, i.e. provide power to, electric motors. An H-bridge can act as a series of switches that, when closed, provide a path for current flowing through the motor. A four-switch or "full" H-bridge can be used to turn a motor off, turn a motor on in a forward direction, and turn a motor on in a reverse direction.

A two-switch or "half" H-bridge has two switches that can be used to provide power to a load. Half H-bridges are sometimes used in motor driver circuits, switching amplifier circuits, switching power supply circuits, and the like.

The switches in Hi-bridge circuits are often implemented by electronic switches such as transistors, i.e. field effect transistors (FETs) or BJT transistors. As is known, in order to turn a FET on or off, a voltage must be applied to the transistor's gate. In the case of a BJT, a current supplied to the transistor's base is used to turn the transistor on and off. However, in some H-bridge designs it may be difficult to drive the gate of the transistor hard enough under low voltage conditions to adequately turn the FET on or off. In other H-bridge designs, if the gate of the transistor is driven too hard under high voltage conditions, and a gate-source voltage (Vgs) becomes too great, the FET can become damaged. As is known in the art, FETs typically have source, drain, and gate terminals used in schematic circuit drawings.

In many applications, an H-bridge must be able to operate under both high and low voltage conditions. For example, an H-bridge that drives a pump motor in an automobile may be subject to large swings in the voltage supplied by the battery or alternator. These swings can be caused by the engine starting up, the engine running at varying speeds, electric window or wiper motors turning on and off etc. For these reasons, it would be beneficial to provide circuitry that can drive the switches of an H-bridge under high, low, and normal voltage conditions.

SUMMARY

Figure 1:
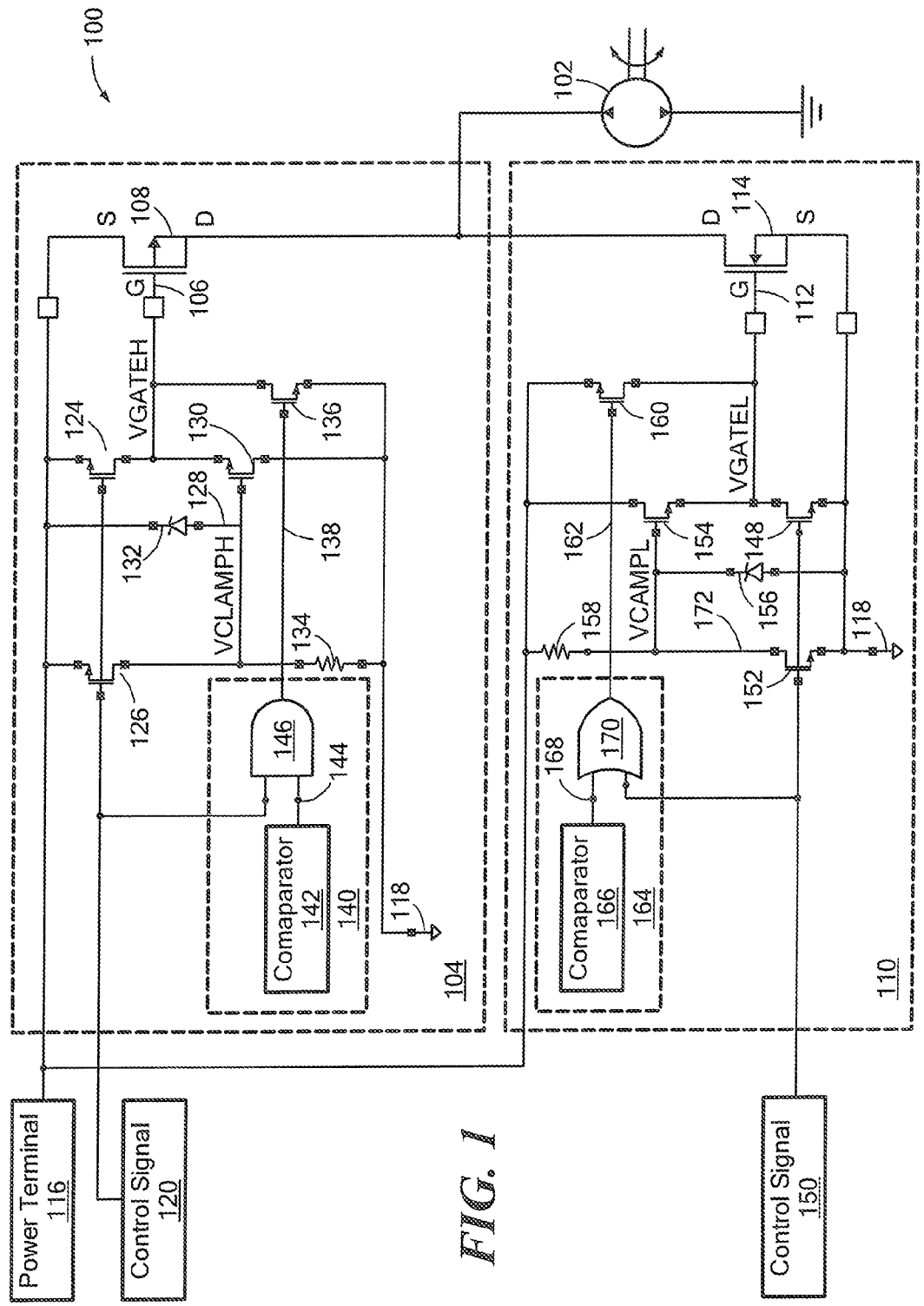
FIG. 1 is a circuit diagram of an electronic circuit for driving the gates of a p-channel and n-channel FET.

In an embodiment, an electronic circuit for driving a gate of a field-effect transistor (FET), the electronic circuit includes a first voltage terminal coupled to receive a first voltage from a power supply and a second voltage terminal coupled to receive a second voltage from the power supply. A driver circuit is configured to drive the voltage at the gate of the FET to an intermediate voltage level in order to turn on the FET during a high voltage condition or a normal voltage condition between the first and second voltage terminals. A clamp circuit is configured, when active, to clamp the voltage at the gate of the FET to the second voltage terminal in order to turn on the FET during a low voltage condition between the first and second voltage terminals, so that the FET can enhance power provided to a load during the low voltage condition. A low voltage detection circuit is configured to detect the low voltage condition and provide a signal to the clamp circuit that allows the clamp circuit to become active during the low voltage condition.

The electronic circuit may also include a transistor in a common-source configuration having a drain terminal coupled to the gate of the FET and a source terminal coupled to first voltage terminal in order to turn the FET off by clamping the gate of the FET to the first voltage terminal. The detection circuit can include a comparator to determine whether a higher one of the first and second voltages has crossed a low voltage threshold.

The electronic circuit may be configured to drive a p-channel FET, an n-channel FET or both. The electronic circuit may also be configured in an h-bridge arrangement, and may be used for driving a load such as a motor.

DETAILED DESCRIPTION

As used within this document, the term FET refers to a field-effect transistor. The FET may be a MOSFET, JFET, IGFET, Carbon nanotube FET (CNTFET), DNAFET, MESFET, NOMFET, POWER FET, or any type of field effect transistor. The term FET, as used herein, can also apply to circuits that approximate or are equivalent to FETs, such as electronic switches.

As used within this document, the term "off," when used in connection with the operation of a transistor, refers to non-conductive state of the transistor where little to no current flows between the drain and source terminals (or the collector and emitter of a BJT). An example of an "off" state is the cutoff, subthreshold, or weak-inversion mode of a FET, or the cutoff mode of a BJT.

As used within this document, the term "on," when used in connection with the operation of a transistor, refers to a conductive mode of the transistor where current can flow between the drain and source terminals (or the collector and emitter of a BJT). "On" may refer to either a saturation mode or a linear/resistive mode of the transistor. An example of an "on" state is the triode, linear, saturation, or active modes of a FET, or the forward-active or saturation modes of a BJT.

As used herein, the term "node" and the term "terminal" may refer to points where elements or branches of a circuit may be connected.

A FET may be either n-channel or p-channel. The figures depict FETs using common FET symbols having arrows that point across PN junctions from P to N. For example, in FIG. 1, the symbols used for FET 108 and FET 124 depict p-channel FETs, and the symbols used for FET 114 and FET 160 depict n-channel FETs. However, one skilled in the art will recognize that alternative embodiments of the invention may substitute n-channel FETs for p-channel FETs or vice versa, may use alternate components in place of the FETs shown in the figures, may implement all or part of the invention with executable code executed by a processor or stored on a computer readable storage medium, or may implement the invention in various other embodiments. Although the figures depict some FETs as enhancement mode FETs and other FETs as depletion mode FETs, this is not intended to be limiting. In various embodiments, enhancement mode FETs can be replaced by depletion mode FETs or vice versa, if desired.

As used within this document, when a FET "drives" a terminal or terminal to a voltage level, the FET generally turns on and allows the voltage at the drain terminal to reach the particular voltage level. In some instances, when a FET is driven, the voltage at the drain terminal may reach the level of the source voltage. The term "drive," as used within this document, can indicate that a voltage at a terminal is being clamped or held at a particular voltage level, but can also mean that a FET is on, is allowing current to flow through the FET, and is allowing the voltage at the driven terminal or the source terminal to float to a particular voltage level.

Referring to FIG. 1, a circuit 100 for driving a load 102 is shown. The circuit 100 includes a sub-circuit 104 for driving the gate terminal 106 of a p-channel FET 108, and a sub-circuit 110 for driving the gate terminal 112 of an n-channel FET 114. As shown, the p-channel FET 108 may have a source terminal coupled to a power terminal 116, a drain terminal coupled to a load 102, and a gate terminal 106 driven by sub-circuit 104. The n-channel FET may have a source terminal coupled to ground 118, a drain terminal coupled to the load 102, and the gate terminal 112 driven by sub-circuit 110. The power terminal 116 may provide a "high," regulated DC voltage, such as 3V, 5V, 12V, 24V, or any other desired voltage relative to the ground terminal 118. The power terminal 116 may also be able to source electrical current demanded by circuit 100 and load 102. In an embodiment, the power terminal 116 may receive power from a power source including, but not limited to: a battery, an alternator, a generator, a voltage or current regulator, an automotive controller, or another power source subject to high and low voltage conditions.

When driven by the sub-circuits 104 and 110, the p-channel FET 108 and the n-channel FET 114 may alternately switch on and off to provide power to the load 102. For example, when the p-channel FET 108 is on and the n-channel FET 114 is off, current may flow from the power terminal 116, through the p-channel FET 108 to the load 102. Similarly, when the p-channel FET 108 is off and the n-channel FET 114 is on, the load 102 may be coupled to ground 118 through the n-channel FET 114. By alternating the p-channel FET 108 and the n-channel FET 114 on and off, the amount of power provided to the load 102 can be precisely controlled. In an embodiment, the voltage supplied at the gate terminal 106 of the p-channel FET 108 and/or the voltage supplied at the gate terminal 112 of the n-channel FET 114 may be pulse-width modulated in order to control the amount of power supplied to the load 102.

The p-channel FET 108 and the n-channel FET 114 may be any type of voltage controlled current source or electronic switch. In an embodiment, the p-channel FET 108 and the n-channel FET 114 may be JFET, MOSFET, or any other type of FET. The p-channel FET 108 and the n-channel FET 114 may also be replaced by relays, BJTs, DMOS transistors, or any type of electrical component or circuit that can switch on and off.

Although depicted as a motor, the load 102 can be any type of electrical load. In an embodiment, the load 102 may be a resistor, a fan motor, a power regulator, a silicon chip, a motor that drives a power-steering pump in a vehicle, etc.

In order to drive the gate terminal 106 of p-channel FET 108, the sub-circuit 104 may receive a control signal 120. The control signal 120 may be coupled to the gate of FET 124. The source terminal of FET 124 may be coupled to the power terminal 116 and the drain terminal of FET 124 may be coupled to the gate terminal 106 of p-channel FET 108. In this arrangement, when the control signal 120 is low (i.e. at ground potential), the FET 124 will turn on in saturation mode and clamp the gate terminal 106 to the power terminal 116, i.e. clamp the gate terminal 106 high, and turn p-channel FET 108 off.

In an embodiment, the control signal 120 may be a pulse-width modulated signal. The width of the pulses on the control signal 120 may control the power provided to the load 102 by controlling how long the p-channel FET 108 is on or off.

The control signal 120 may also be coupled to the gate of FET 126. Like the FET 124, the FET 126 may also be arranged in a common-source configuration. The source of the FET 126 may be coupled to the power terminal 116 and the drain of the FET 126 may be coupled to a terminal 128 in order to drive the gate of the FET 130.

The FET 130 may be connected in a source-follower, or common-drain configuration. In other words, the drain of the FET 130 is coupled to ground 116 and the source of the FET 130 is coupled to the gate terminal 106 of the p-channel FET 108. This allows the FET 130 to drive the gate terminal 106 to an intermediate voltage level, rather than clamping the gate terminal 106 to ground, as will be discussed below.

So that the FET 130 can drive the gate terminal 106 to an intermediate voltage, sub-circuit 104 may also include a voltage regulator 132 and a resistor 134. In an embodiment, the voltage regulator 132 may be a zener diode, as shown FIG. 1, or may be any type of voltage regulator that can maintain a constant voltage between the power terminal 116 and the gate of the FET 130. In an embodiment, the voltage regulator 132 may provide a maximum voltage between the power terminal 116 and the gate of the FET 130. In other words, the voltage regulator 132 may be configured to allow the voltage between the power terminal 116 and the gate of the FET 130 to fall below a predetermined voltage, but not to increase above the predetermined voltage. The resistor 134 allows voltage at the terminal 128 to float with respect to ground.

The sub-circuit 104 also includes a FET 136 in a common-source configuration. The source of the FET 136 may be coupled to ground, the drain of the FET 136 may be coupled to the gate terminal 106, and the gate of the FET 136 may be coupled to receive a control signal 138.

In embodiments of circuit 100, the sub-circuit 104 may include a logic circuit 140 that produces the control signal 138. The logic circuit 140 can include a comparator 142 coupled to produce logic signal 144. The comparator 142 may be configured to assert (i.e. provide a high voltage to) the signal 144 whenever the voltage at the power terminal 116 drops below a predetermined threshold, and de-assert (i.e. provide a low voltage to) the signal 144 whenever the voltage at the power terminal 116 is higher than the predetermined threshold. In embodiments of the circuit 100, the predetermined threshold may be set to detect a low voltage condition on power terminal 116. In other words, comparator 142 may assert the signal 144 during a low voltage condition on the power terminal 116, and de-assert the signal 144 during normal or high voltage conditions on the power terminal 116.

The logic circuit 140 may also include an AND gate 146 coupled to receive the control signal 120 and the logic signal 144, and to produce the control signal 138. The AND gate 146 may be configured to assert the control signal 138 whenever both the control signal 120 and the logic signal 144 are high, and to de-assert the control signal 138 whenever either the control signal 120 or the logic signal 144 are low. In this configuration, the AND gate 142 may act to pass the control signal 120 through to the gate of the FET 136 during low voltage conditions, and turn the FET 136 off during normal and high voltage conditions.

In various embodiments, the sub-circuit 110 may operate conversely with respect to sub-circuit 104. As is known in the art, PNP and NPN transistors, when used in switching applications, complement each other. For example, while the p-channel FET 108 turns off when the voltage at the gate terminal 106 is high and turns on when the voltage at the gate terminal 106 is low, the n-channel FET 114 operates in an opposite manner; it turns on when the voltage at the gate terminal 112 is high and turns off when the voltage at the gate terminal 112 is low. Therefore, since the gate terminal 114 should be driven inversely to the gate terminal 106, the sub-circuit 110 may be configured to drive the gate terminal 114 inversely. As such, the sub-circuit 110 may comprise of complementary elements to those within sub-circuit 104. One skilled in the art will recognize that, although the logic and voltage levels in sub-circuit 110 may be converse to those in sub-circuit 104, the two sub-circuits are complements of each other and operate in a similar fashion.

Sub-circuit 110 may include an n-channel FET 148 having a source coupled to ground 110 and a drain coupled to the gate terminal 112, in a converse arrangement to the FET 124. The gate of the FET 148 is coupled to receive control signal 150. The gate of FET 152 also receives control signal 150. The source of the FET 152 is coupled to ground 118 and the drain of the FET 152 is coupled to the gate of a FET 154 so that, when the FET 152 is on, the FET 152 can clamp the gate of the FET 154 to ground 118, and when the FET 152 is off, the voltage at the gate of the FET 154 can be maintained at an intermediate voltage level.

So that the FET 154 can drive the gate terminal 112 to an intermediate voltage, sub-circuit 110 may also include a voltage regulator 156 and a resistor 158. In an embodiment, the voltage regulator 156 may be a zener diode, as shown in FIG. 1, or may be any type of voltage regulator that can maintain a constant voltage between ground 118 and the gate of the FET 154. In an embodiment, the voltage regulator 156 may limit the voltage between ground 118 and the gate of the FET 154 to a maximum voltage. In other words, the voltage regulator 156 may be configured to allow the voltage between ground 118 and the gate of the FET 154 to fall below a predetermined voltage, but not to increase above the predetermined voltage. The resistor 158 may act as a pull-up resistor, that pulls the voltage at the gate of the FET 154 to the voltage at the power terminal 116, and that also allows the voltage at the gate of FET 154 to be clamped to ground 118 by the FET 152.

The sub-circuit 110 may also include a FET 160 in a common-source configuration. The source of the FET 160 may be coupled to the power terminal 116, the drain of the FET 160 may be coupled to the gate terminal 112, and the gate of the FET 160 may be coupled to receive a control signal 162.

In embodiments of circuit 100, the sub-circuit 110 may include a logic circuit 164 that produces the control signal 162. The logic circuit 164, as shown in FIG. 1, includes a comparator 166 coupled to produce a logic signal 168. The comparator 166 may be configured to de-assert (i.e. provide a low voltage to) the signal 168 whenever the voltage at the power terminal 116 drops below a predetermined threshold, and assert (i.e. provide a high voltage to) the signal 168 whenever the voltage at the power terminal 116 is higher than the predetermined threshold. In embodiments of the circuit 100, the predetermined threshold may be set to detect a low voltage condition on power terminal 116. In other words, comparator 166 may assert the signal 168 during a low voltage condition on the power terminal 116, and de-assert the signal 168 during normal or high voltage conditions on the power terminal 116.

The logic circuit 164 may also include an OR gate 170 coupled to receive the control signal 150 and the logic signal 168, and to produce the control signal 138. The OR gate 146 may be configured to assert the control signal 162 whenever either the control signal 150 or the logic signal 168 are high, and to de-assert the control signal 162 whenever both the control signal 150 and the logic signal 168 are low. In this configuration, the OR gate 170 may act to pass the control signal 150 through to the gate of the FET 160 during low voltage conditions, and maintain the signal 162 at a high voltage during normal and high voltage conditions in order to maintain the FET 160 in an off state during the normal and high voltage conditions.

In an embodiment, the p-channel FET 108 and the n-channel FET 114 may be switched on and off in an alternating fashion. For example, when the p-channel FET 108 is on, the n-channel FET 114 may be off, and vice versa. This may allow the electronic circuit 100 to alternate coupling the load 102 to the power terminal 116 and coupling the load 102 to ground 118. To this end, the control signals 120 and 150 can have opposing states so that the FETs do not create a short circuit between the power terminal 116 and ground, or an open circuit where current cannot flow.

Figure 2:
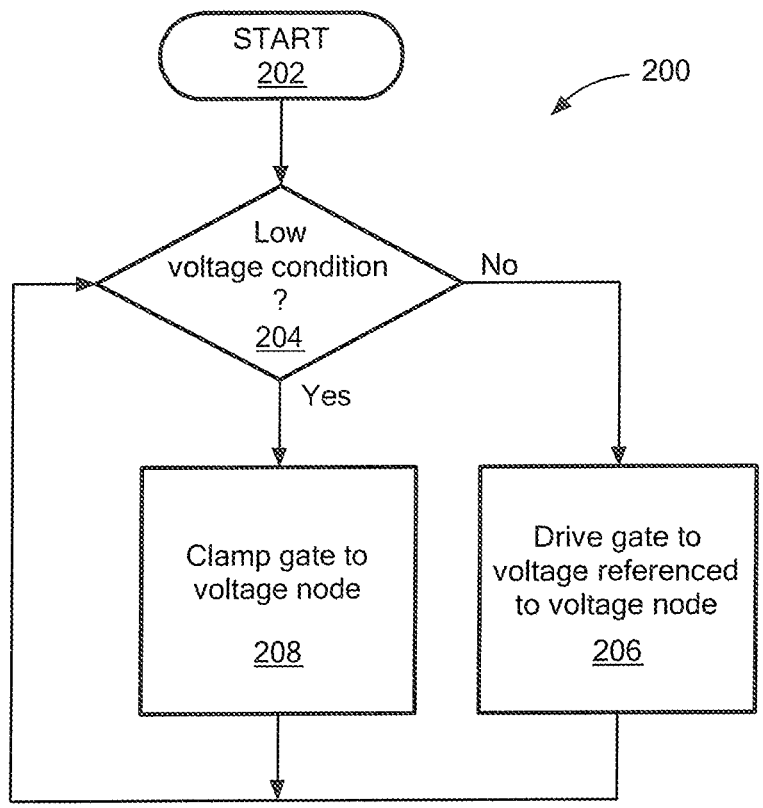
FIG. 2 is a flowchart of a process for driving the gate of a FET under low, normal, and/or high voltage conditions.

Referring also to FIG. 2, a flowchart diagram depicts a process 200 for driving a load. In various embodiments, the process 200 may be implemented by electronic circuit 100 (FIG. 1). The start block 202 represents the start of operation of the circuit 100, such as when the circuit 100 is powered on. As the circuit 100 operates, it may detect whether a low voltage condition has occurred, as shown by block 204. For example, comparator 142 and comparator 166 may detect whether a low voltage condition on power terminal 116 is occurring, and, depending on whether the low voltage condition is occurring, comparator 142 and comparator 166 may assert or de-assert control signals 144 and 168, respectively.

If a low voltage condition is not detected, electronic circuit 100 may drive the gate terminals 106 and 112 to an intermediate voltage level that is referenced to a voltage terminal, as shown by block 206. For example, looking at sub-circuit 104, logic circuit 140 may provide a constant voltage to the gate of the FET 136 so that the FET 136 remains off. Under these conditions, as long as FET 136 is off, the FET 130 can drive the voltage at the gate terminal 106 to an intermediate voltage. The intermediate voltage may be sufficiently low to turn the FET 108 on under normal and high voltage conditions. The intermediate voltage may also be limited by voltage regulator 132 so that the FET 108 does not become damaged by a high voltage condition. For example, if the voltage at power terminal 116 increases due to a high power condition, but the voltage at gate terminal 106 is pulled low, a large gate-source voltage (Vgs) across the p-channel FET 108 may damage the p-channel FET 108. To reduce the possibility of damage, voltage regulator 132 and resistor 134 allow the voltage at the gate terminal 106, when driven by the FET 130, to follow the voltage at the power terminal 116.

Under a high or normal voltage condition, the comparator 142 and the AND gate 146 will hold the logic signal 138 low and prevent the control signal 120 from passing through to the gate of the FET 136. Therefore, under a high or normal voltage condition, the FET 136 will remain off and the voltage at the gate terminal 106 will be driven by the FET 124 and the FET 130.

This will allow the voltage at the gate terminal 106, when driven low by the FET 130, to be driven to an intermediate voltage rather than being pulled to ground 118. In other words, the voltage at the gate terminal 106 will follow the voltage at the gate terminal 128, which will follow the voltage at the power terminal 116. Therefore, as the voltage at the power terminal 116 increases, the voltage at the gate terminal 106 will also increase so that the gain-source voltage (Vgs) across the p-channel FET 108 does not become great enough to damage the p-channel FET 108.

To illustrate, when the control signal 120 is high, the FET 126 turns off. When the FET 126 is off, the voltage at terminal 128 is pulled down by resistor 134. However, the voltage regulator 132 maintains a maximum voltage between the terminal 128 and the power terminal 116 so that the voltage at the terminal 128 is referenced to, and follows, the voltage at the power terminal 116.

Assume, for example, that the voltage regulator 132 is a zener diode with a reverse breakdown voltage of 12V and the voltage at the power terminal 116 is experiencing a high voltage condition of 24V. In this case, when the control signal 120 is high, the FET 126 and the FET 124 turns off and the voltage at the terminal 128 may be 12V. This is because the voltage across the voltage regulator 132 may be 12V (Vpower−Vregulator=24V−12V=12V). If the voltage at the power terminal 116 were 18V, the voltage at the terminal 128 would be 6V (Vpower−Vregulator=18V−12V=6V). Thus, the voltage regulator 132 may tie the voltage at the terminal 128 to a voltage that is a fixed amount lower than the voltage at the power terminal 116. As the voltage at the power terminal 116 increases, the voltage at the terminal 128 will also increase.

Because the FET 130 is coupled in a common-drain configuration, the FET 130 may act like a source follower. In other words, the voltage at the source of FET 130 (i.e. the voltage at gate terminal 106) will follow the voltage at the gate of FET 130 with an approximate gain of one. Therefore, as the voltage at the power terminal 116 increases, the voltage at the terminal 128 and the gate terminal 106 will follow so that the Vgs across the FET 108 does not become large enough to damage the FET 108.

One skilled in the art will recognize that the sub-circuit 110 may act in a complementary fashion. For example, under a high or normal voltage condition, the comparator 166 and the OR gate 170 holds the logic signal 162 low and prevents the control signal 150 from passing through to the gate of the FET 160. Under these circumstances, the FET 160 remains off and the voltage at the gate terminal 112 will be driven by the FET 148 and the FET 154.

This may allow the voltage at the gate terminal 112, when driven high by the FET 154, to be driven to an intermediate voltage rather than being clamped to the power terminal 116. To illustrate, when the control signal 150 is high, the FET 148 may be on and may pull the voltage at the gate terminal 112 to ground 118. The FET 152 may also pull the terminal 172 to ground 118 so that the FET 154 turns off. However, when the control signal 150 is low, the FET 148 and the FET 152 may turn off. When the FET 152 is off, the voltage at terminal 128 may be pulled up by resistor 158. However, the voltage regulator 158 may maintain a maximum voltage between the terminal 172 and ground 118 so that the voltage at the terminal 172 is referenced to ground 118. This may allow for a sufficient drain-source voltage (Vds) across the FET 154 so that the voltage at the gate terminal 112 does not become so high that it damages the n-channel FET 114.

To illustrate, when the control signal 150 is low, the FET 152 may turn off. When the FET 152 is off, the voltage at terminal 172 may be pulled up by resistor 158. However, the voltage regulator 156 may maintain a minimum voltage between the terminal 172 and ground 118.

Assume, for example, that the voltage regulator 156 is a zener diode with a reverse breakdown voltage of 12V and the voltage at the power terminal 116 is experiencing a high voltage condition of 24V. In this case, when the control signal 150 is low, the FET 152 and the FET 148 may turn off and the voltage at the terminal 172 may be 12V. This is because the voltage across the voltage regulator 156 may be 12V (Vpower−Vregulator=24V−12V=12V). If, in this example, the voltage at the power terminal 116 were 18V, the voltage at the terminal 128 would remain at 12V, and the Vgs voltage across the FET 154 would be 6V (Vpower−Vregulator=18V−12V=6V).

Referring again to FIG. 2, if a low voltage condition is detected in block 204, the electronic circuit may drive the gate terminals 106 and 112 by clamping the gate terminals 106 and 112 to a respective voltage terminal as shown in block 208. Looking at sub-circuit 104, if a low voltage condition is detected, the logic circuit 140 may pass the control signal 120 through to the gate of the FET 136 so that when the control signal 120 is high, the FET 136 may clamp the gate terminal 106 to ground 118, for example.

Looking at sub-circuit 104, under a low voltage condition, clamping the gate terminal 106 to ground 118 with the FET 136, rather than driving the gate terminal 106 to an intermediate voltage with the FET 130, may allow the p-channel FET 108 to provide greater power to the load 102. Clamping the gate terminal 106 to ground 118 under a low voltage condition allows the FETs 108 and 114 to be turned on all the way, or turned on as much as possible, for all voltage conditions. This not only allows the load 102 to receive as much power as possible, it may also limit the power dissipated by the FETs 108 and 114 under such conditions.

Since the FET 136 is coupled in a common-source configuration, the Vds across the FET 136 may be relatively small when the FET 136 is on. This relatively small drain-source voltage (Vds) may allow the FET 136 to pull the voltage at the gate terminal 106 low. In contrast, because of the relatively larger Vds across the FET 130 described above, the ability of the common-drain FET 130 to turn the p-channel FET 108 fully on may be inhibited under a low voltage condition.

The sub-circuit 110 may act in a complementary fashion. Looking at sub-circuit 110, under a low voltage condition, clamping the gate terminal 112 to the power terminal 116 with the FET 160, rather than driving the gate terminal 112 to an intermediate voltage with the FET 154, may allow the n-channel FET 114 to provide greater power to the load 102. Clamping the gate terminal 112 to the power terminal 160 (or clamping the gate terminal 106 to ground 118) under a low voltage condition allows the FETs 108 and 114 to be turned on all the way, or turned on as much as possible, for all voltage conditions. This not only allows the load 102 to receive as much power as possible, it may also limit the power dissipated by the FETs 108 and 114 under such conditions.

Since the FET 160 is coupled in a common source configuration, the Vds across the FET 160 may be relatively small when the FET 160 is on. This relatively small Vds may allow the FET 160 to pull the voltage at the gate terminal 112 low. In contrast, because of the relatively larger Vds across the FET 154 described above, the ability of the FET 154 to turn the n-channel FET 114 fully on may be inhibited under a low voltage condition.

Referring again to FIG. 2, the process 200 may check for a low voltage condition, as shown in block 204. If a low voltage condition is detected, the circuit 100 can turn the p-channel FET 108 on by clamping the gate terminal 106 to ground 118, and can turn the n-channel FET 114 on by clamping the gate terminal 112 to the power terminal 116, as described above to enhance the amount of power provided to the load 102. If no low voltage condition is detected, the gate terminal 106 and/or the gate terminal 112 can be driven to an intermediate voltage level so that the p-channel FET 108 and/or the n-channel FET 114 do not become damaged by a high-voltage condition.

In an embodiment, the process 200 may continually monitor the voltage condition at block 204 to determine if the electronic circuit 100 is operating under a low, normal, or high voltage condition. As the voltage condition changes from low to normal or high, the electronic circuit may detect the change and may switch between driving the gate terminal to an intermediate voltage that is referenced to a voltage terminal, as shown in box 206, and clamping the gate terminal to the voltage terminal, as shown in box 208.

As shown in FIG. 1, the FET 130 may act as a single-quadrant driver. In other words, the FET 130 can only sink current, and cannot source current. Because of this, the FET 130 and the FET 136 may both be on at the same time without creating a short circuit condition. In another embodiment, the FET 130 could be arranged in a two-quadrant configuration, or could be replaced with a two-quadrant driver. In such an arrangement, the electronic circuit 100 may contain a control signal (not shown) to ensure that the FET 130 is off during a low voltage condition, so that the FET 130 and the FET 136 do not turn on at the same time and cause a short-circuit condition.

Similarly, the FET 154 is configured in as a single-quadrant driver that can only source current to the terminal 112 and cannot sink current from the terminal 112. Because of this, the FET 154 and the FET 160 may both be on at the same time without creating a short circuit condition. In another embodiment, the FET 154 could be arranged in a two-quadrant configuration, or could be replaced with a two-quadrant driver. In such an arrangement, the electronic circuit 100 may contain a control signal (not shown) to ensure that the FET 154 is off during a low voltage condition, so that the FET 154 and the FET 160 do not turn on at the same time and cause a short-circuit condition.

Figure 3:
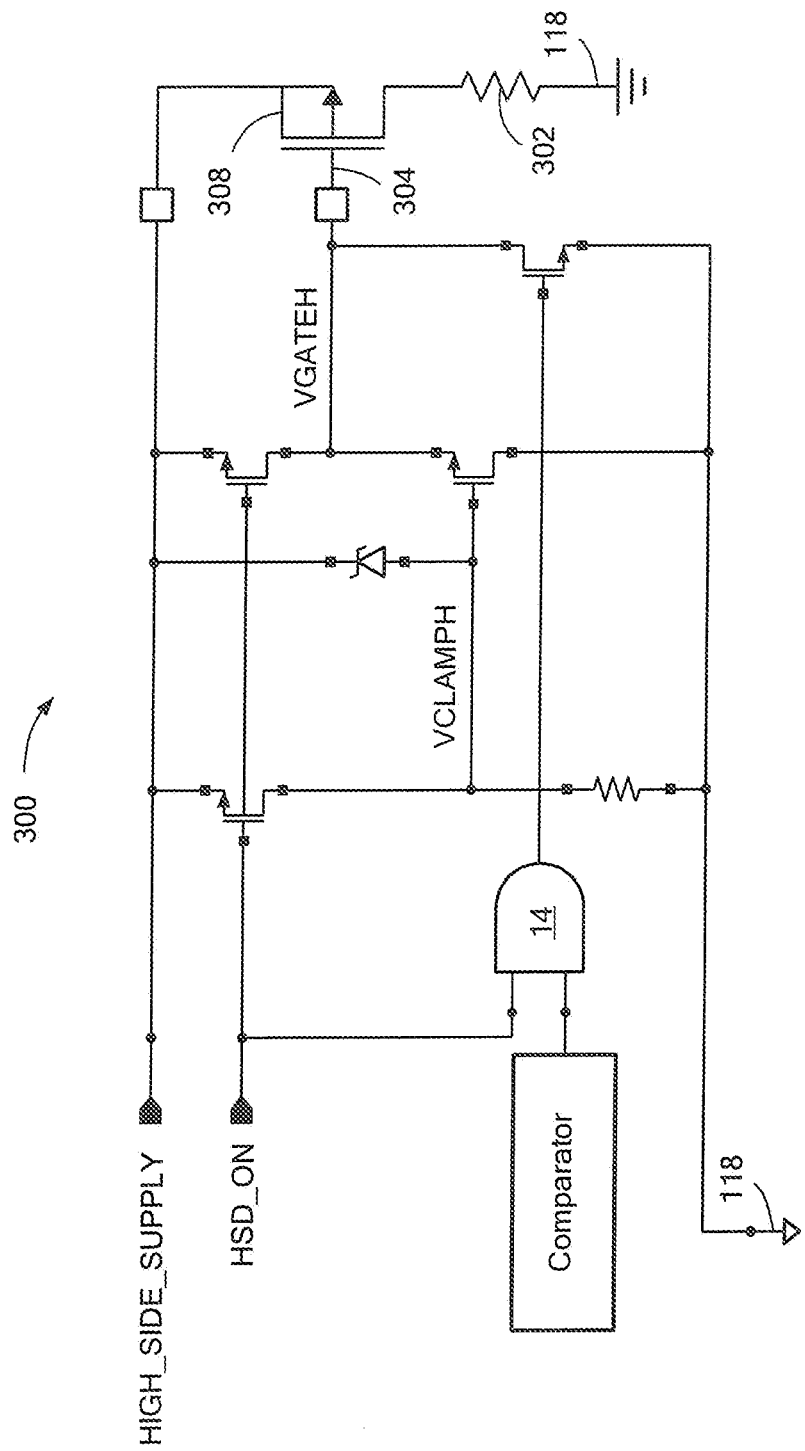
FIG. 3 is a circuit diagram of an electronic circuit for driving the gate of a p-channel FET under low, normal, and/or high voltage conditions.

Referring now to FIG. 3, the process 200 may also be implemented by other electronic circuits. For example, FIG. 3 shows a circuit 300 for driving a load 302. The electronic circuit 300 may include the same or similar components as sub-circuit 104 (FIG. 1) and may drive the gate terminal 304 of p-channel FET 308 in a manner similar to that of sub-circuit 104. As shown, the load 302 may be coupled to the drain of the p-channel FET 308 and to ground 118 so that the electronic circuit 300 can source current to the load 302.

Figure 4:
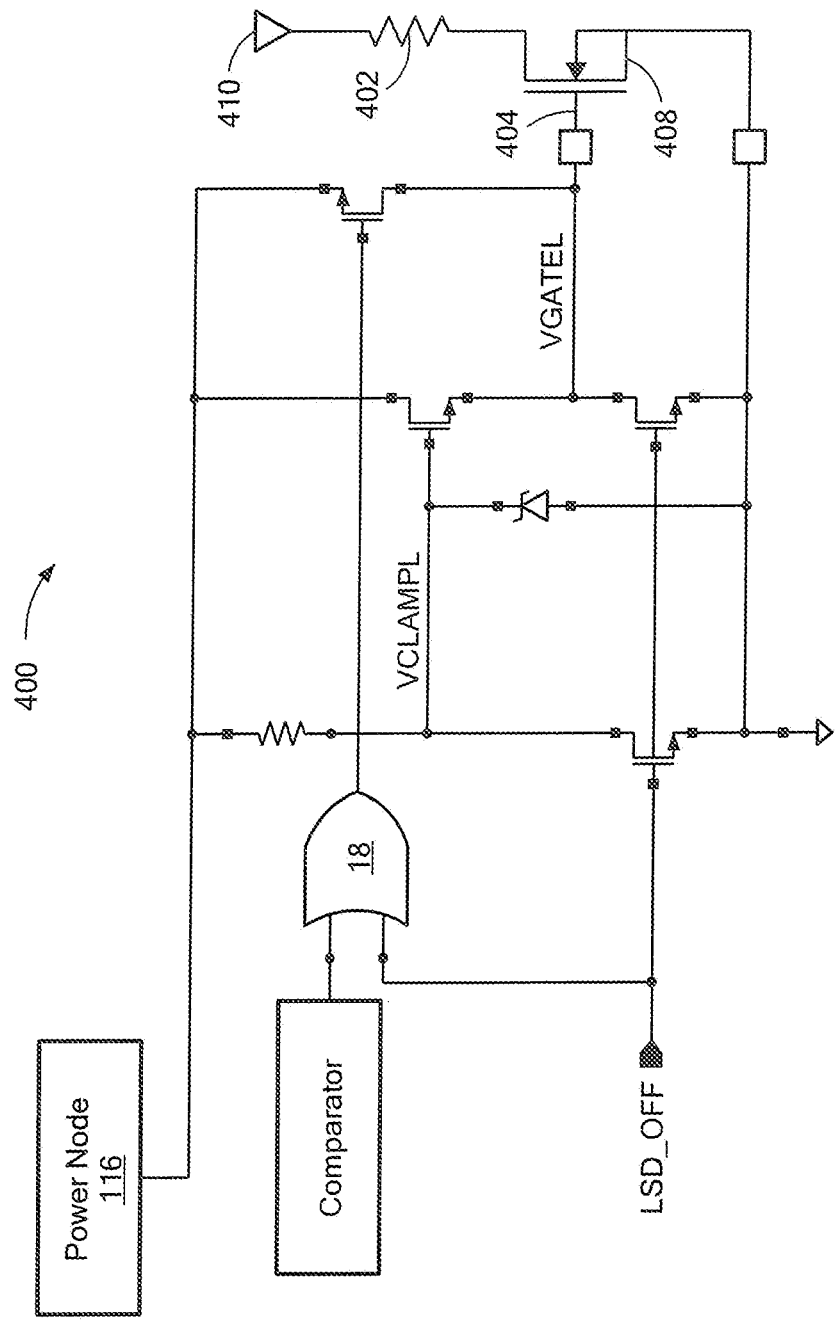
FIG. 4 is a circuit diagram of an electronic circuit for driving the gate of an n-channel FET under low, normal, and/or high voltage conditions.

Referring now to FIG. 4, the process 200 may be implemented by an electronic circuit 400 for driving a load 402. The electronic circuit 400 may include the same or similar components as sub-circuit 110 (FIG. 1) and may drive the gate terminal 404 of n-channel FET 408 in a manner similar to that of sub-circuit 110. As shown, the load 402 may be coupled to the drain of the n-channel FET 308 and to power terminal 410 so that the electronic circuit 400 can act as a current sink for the load, drive the gate terminal 404 of the n-channel FET 408 in a manner similar to that of sub-circuit 110.

Figure 5:
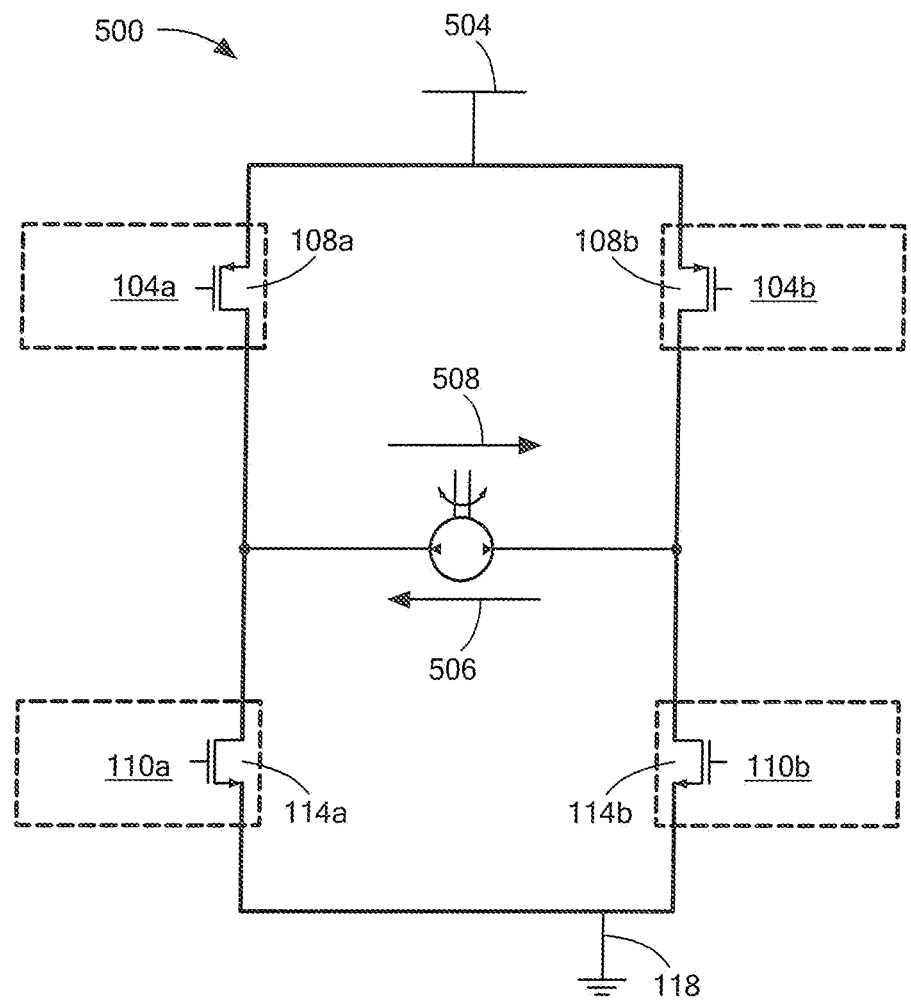
FIG. 5 is a circuit diagram of electronic circuits for driving the gate of an n-channel and p-channel FET under low, normal, and/or high voltage conditions arranged in an H-bridge configuration for driving a motor.

Referring now to FIG. 5, an electronic circuit 500 is shown for driving a load, such as motor 502. However, this is not intended to be a limitation; the motor 502 can be any type of load.

As shown, the circuit 500 may be arranged in an H-bridge configuration with a sub-circuit 104a for driving a p-channel FET 108a, a sub-circuit 104b for driving a p-channel FET 108b, a sub-circuit 110a for driving an n-channel FET 114a, and a sub-circuit 110b for driving an n-channel FET 114b. The sub-circuits 104a and 104b may contain the same or similar components as sub-circuit 104 (FIG. 1) and may operate in a like manner to sub-circuit 104. Similarly, the sub-circuits 100a and 110b may contain the same or similar components as sub-circuit 110 (FIG. 1) and may operate in a like manner to sub-circuit 110.

When arranged in an H-bridge configuration, the sub-circuits 108a, 108b, 110a, and 110b may be used to control the speed and direction of the motor 502. To drive the motor 502 in a first direction, the sub-circuit 104a may turn the p-channel FET 108a off and the sub-circuit 110b may turn the n-channel FET 114b off. The sub-circuit 104b may then turn the p-channel FET 108b on and the sub-circuit 110a may turn the n-channel FET 114a on so that a current path is created from the power terminal 504, through the p-channel FET 108b, through the motor 502 in the direction shown by the arrow 506, through the n-channel FET 114a, and finally to ground 118. The sub-circuit 108b and/or the sub-circuit 110a may also pulse the FET 108b and/or the FET 114a, respectively, on and off to control the amount of power supplied to the motor 502.

Although the embodiments are described above as using FETs, it should be appreciated that other switching circuits can be used in place of the FETs. These circuits can include, but are not limited to, BJT transistors, relays, amplifiers, electromechanical switches, etc.

To drive the motor 502 in a second direction, the sub-circuit 104b may turn the p-channel FET 108b off and the sub-circuit 110a may turn the n-channel FET 114a off. The sub-circuit 104a may then turn the p-channel FET 108a on and the sub-circuit 110b may turn the n-channel FET 114b on so that a current path is created from the power terminal 504, through the p-channel FET 108a, through the motor 502 in the direction shown by the arrow 508, through the n-channel FET 114b, and finally to ground 118. The sub-circuit 108a and/or the sub-circuit 110b may also pulse the FET 108a and/or the FET 114b, respectively, on and off to control the amount of power supplied to the motor 502.

Having described various embodiments, which serve to illustrate various concepts, structures and techniques, which are the subject of this patent, it will now become apparent to those of ordinary skill in the art that other embodiments incorporating these concepts, structures and techniques may be used. Accordingly, the scope of the patent should not be limited to the described embodiments but rather should be limited only by the spirit and scope of the following claims.

What is claimed is:

1. An electronic circuit for driving a load, the electronic circuit comprising:
   a first voltage terminal coupled to receive a first voltage from a power supply;
   a second voltage terminal coupled to receive a second voltage from the power supply;
   a driver circuit comprising a drive transistor coupled in a source-follower or emitter-follower configured to drive a voltage at a control terminal of an electronic switch to an intermediate voltage level in order to turn on the electronic switch during a high voltage condition or a normal voltage condition between the first and second voltage terminals;
   a clamp circuit comprising a clamp transistor coupled in a common-source or common-emitter configuration configured, when active, to clamp the voltage at the control terminal of the electronic switch to the second voltage terminal in order to turn on the electronic switch during a low voltage condition between the first and second voltage terminals so that the electronic switch can enhance power provided to a load during the low voltage condition; and a low voltage detection circuit in electrical communication with the first voltage terminal and the clamp circuit, the low voltage detection circuit configured to detect the low voltage condition and provide a signal to the clamp circuit that allows the clamp circuit to become active during the low voltage condition.

2. The electronic circuit of claim 1 wherein the electronic switch is a BJT or DMOS.

3. The electronic circuit of claim 1 wherein the electronic switch is a FET and the control terminal is a gate of the FET.

4. The electronic circuit of claim 3, wherein the FET is a p-channel FET, the first voltage terminal is a power line voltage terminal, and the second voltage is a ground voltage.

5. The electronic circuit of claim 3, wherein the FET is an n-channel FET, the first voltage is a ground voltage, and the second voltage is a power line voltage.

6. The electronic circuit of claim 3, wherein the driver circuit is a single-quadrant driver circuit configured to either sink to the gate of the FET or source current from the gate of the FET.

7. The electronic circuit of claim 3, wherein the driver circuit is a two-quadrant driver circuit configured to sink current to the gate of the FET and source current from the gate of the FET.

8. The electronic circuit of claim 1, further comprising a second clamp circuit coupled to clamp the control terminal of the electronic switch to the first voltage terminal.

9. The electronic circuit of claim 8 wherein the second clamp circuit comprises a transistor in a common-source configuration having a drain terminal coupled to the gate of the FET and a source terminal coupled to first voltage terminal in order to turn the FET off by clamping the gate of the FET to the first voltage terminal.

10. The electronic circuit of claim 1, wherein the driver transistor coupled in the source-follower configuration comprises a source terminal coupled to the control terminal of the electronic switch and a drain terminal coupled to the second voltage terminal so that, when the transistor is on, the voltage at the control terminal of the electronic switch floats with respect to the second voltage terminal.

11. The electronic circuit of claim 10, wherein a gate terminal of the transistor is referenced to the first voltage terminal so that, under the high voltage condition, a gate-source voltage ($V_{GS}$) between the gate of the FET and a source terminal of the FET cannot increase to a level that would damage the FET.

12. The electronic circuit of claim 1, wherein the clamp transistor coupled in the common-source configuration comprises a source terminal coupled to the second voltage terminal and a drain terminal coupled to the control terminal of the electronic switch so that, when the clamp circuit is activated, the transistor can clamp the control terminal of the electronic switch to the second voltage terminal.

13. The electronic circuit of claim 1, wherein the detection circuit includes a comparator to determine whether a higher one of the first and second voltages has crossed a low voltage threshold.

14. The electronic circuit of claim 1, wherein one or both of the first and second voltages are provided by a battery, an alternator, a generator, a voltage or current regulator, an automotive controller, or an automotive power source subject to high and low voltage conditions.

15. The electronic circuit of claim 1, wherein the electronic switch is configured to drive a motor.

16. The electronic circuit of claim 15, wherein the motor is a pump motor.

17. The electronic circuit of claim 1, wherein the detection circuit comprises hysteresis, a filter, or both, that limit rapid voltage fluctuations of the first voltage from causing the second clamp circuit to engage.

18. A method of driving a gate of a field-effect transistor (FET), the method comprising:

driving the gate of the FET with a driver circuit comprising a drive transistor coupled in a source-follower or emitter-follower configuration, the driver circuit configured to drive the gate of the FET to an intermediate voltage level between a voltage at a first terminal and a voltage at a second terminal to allow the FET to provide power to a load under high voltage or normal voltage conditions on the first or second terminals;

detecting whether the first or second terminals are under a low voltage condition; and if the low voltage condition is detected, driving the gate with a clamp circuit comprising a clamps transistor coupled in a common-source or common-emitter configuration that clamps the gate to either the first or second voltage terminals so that the FET can enhance power provided to the load under the low voltage condition.

19. An electronic circuit for driving a load, the electronic circuit comprising:

a power terminal coupled to a receive a voltage from a power supply;

a ground terminal coupled to a ground of the power supply;

a circuit for driving a gate of a p-channel field-effect transistor (FET) including:

a first driver circuit comprising a first drive transistor coupled in a source-follower or emitter-follower configuration configured to drive the voltage at the gate of the p-channel FET to an intermediate voltage level in order to turn on the p-channel FET during a high voltage condition or a normal voltage condition between the power terminal and the ground terminal; and a first clamp circuit comprising a first clamp transistor coupled in a common-source or common-emitter configuration configured, when active, to clamp the voltage at the gate of the p-channel FET to the ground terminal in order to turn on the p-channel FET during a low voltage condition between the first and second voltage terminals so that the p-channel FET can enhance power provided to a load during the low voltage condition; and a circuit for driving a gate of an n-channel FET including:

a second driver circuit comprising a second drive transistor coupled in a source-follower or emitter-follower configuration configured to drive the voltage at the gate of the n-channel FET to an intermediate voltage level in order to turn on the n-channel FET during the high voltage condition or the normal voltage condition between the power terminal and the ground terminal; and a second clamp circuit comprising a second clamp transistor coupled in a common-source or common-emitter configuration configured, when active, to clamp the voltage at the gate of the n-channel FET to the power terminal in order to turn on the n-channel FET during the low voltage condition between the first and second voltage terminals so that the n-channel FET can enhance power provided to the load during the low voltage condition; and a detection circuit in communication with the power terminal to determine whether the electronic circuit is operating under the low voltage condition, and in communication with the first and second clamp circuits to provide a signal that allows the first and second clamp circuits to become active during the low voltage condition.

* * * * *

UNITED STATES PATENT AND TRADEMARK OFFICE
CERTIFICATE OF CORRECTION

| | | |
|---|---|---|
| PATENT NO. | : 8,970,265 B2 | Page 1 of 1 |
| APPLICATION NO. | : 13/827074 | |
| DATED | : March 3, 2015 | |
| INVENTOR(S) | : James McIntosh et al. | |

It is certified that error appears in the above-identified patent and that said Letters Patent is hereby corrected as shown below:

In the Specification

Column 1, Line 12-13 delete "used drive," and replace with --used to drive--.

Column 1, Line 22 delete "Hi-bridge" and replace with --H-bridge--.

Column 2, Line 20 delete "to first" and replace with --to the first--.

Column 2, Line 27 delete "h-bridge" and replace with --H-bridge--.

Column 10, Line 7 delete "100a" and replace with --110a--.

In the Claims

Column 11, Line 36 delete "to first" and replace with --to the first--.

Column 12, Line 35 delete "drive" and replace with --driver--.

Column 12, Line 53 delete "drive" and replace with --driver--.

Signed and Sealed this
Twenty-fourth Day of May, 2016

Michelle K. Lee
*Director of the United States Patent and Trademark Office*